(12) United States Patent
Garioni

(10) Patent No.: US 6,257,819 B1
(45) Date of Patent: Jul. 10, 2001

(54) SYSTEM FOR HANDLING AND IN PARTICULAR FOR HOOKING AND PICKING UP FLEXIBLE PRINTED CIRCUITS TO BE INTRODUCED INTO A KILN OR THE LIKE

(76) Inventor: Alessandro Garioni, Via Don Sturzo, 31, I-20078 San Colombano al Lambro (MI) (IT)

( * ) Notice: Subject to any disclaimer, the term of this patent is extended or adjusted under 35 U.S.C. 154(b) by 0 days.

(21) Appl. No.: 09/140,635

(22) Filed: Aug. 26, 1998

(30) Foreign Application Priority Data

Aug. 26, 1997 (IT) .............................. PC97A0018

(51) Int. Cl.⁷ .................................................. B65G 49/06
(52) U.S. Cl. ........................ 414/155; 271/69; 271/85; 271/306; 198/409; 414/172; 414/191
(58) Field of Search .......................... 414/20, 152, 155, 414/160, 172, 180, 186, 191, 209, 210, 225.01, 226.01, 618, 779, 783, 391; 198/409, 468.2, 468.6; 271/69, 85, 306

(56) References Cited

U.S. PATENT DOCUMENTS

| | | | |
|---|---|---|---|
| 2,172,386 | * 9/1939 | Huff | 414/155 |
| 3,410,387 | * 11/1968 | Wennberg et al. | 198/409 |
| 3,905,495 | * 9/1975 | Wayne | 198/409 X |
| 4,586,326 | * 5/1986 | Igel | 414/392 X |
| 4,880,489 | * 11/1989 | Ehrenfeldner et al. | 414/155 X |
| 5,082,192 | * 1/1992 | Langen et al. | 198/409 X |
| 5,147,026 | * 9/1992 | Scaglia | 198/409 |
| 5,149,353 | * 9/1992 | Sipila et al. | 414/155 X |
| 5,354,153 | * 10/1994 | Ottone et al. | 414/20 X |
| 5,427,225 | * 6/1995 | Namba | 198/409 |
| 5,456,814 | 10/1995 | Metzka | 204/297 R |
| 5,967,291 | * 10/1999 | Hansen | 198/409 |

FOREIGN PATENT DOCUMENTS 2 622 383   4/1989   (FR) .

* cited by examiner

Primary Examiner—James W. Keenan
(74) Attorney, Agent, or Firm—Young & Thompson

(57) ABSTRACT

A device for hooking, picking up and unloading flexible printed circuits to be introduced into a kiln, comprising one or more jaws to grip the circuit and to rotate freely around a horizontal axis—to supports which slide along vertical guides; handling systems adapted to move the supports along the vertical guides so as to move the jaws from the circuit feed position to the position in which the circuits are inserted into the kiln; systems designed to impose a slight rotation on the supports in at least one direction around the horizontal axis; and systems designed to activate the rotating pistons only at the circuit unloading stage after the treatment cycle in the kiln, so as to place the circuits in a slightly tilted position.

3 Claims, 3 Drawing Sheets

SYSTEM FOR HANDLING AND IN PARTICULAR FOR HOOKING AND PICKING UP FLEXIBLE PRINTED CIRCUITS TO BE INTRODUCED INTO A KILN OR THE LIKE

FIELD OF THE INVENTION

This invention relates to a system designed to handle the flexible type of printed circuit, and in particular to hook and pick up circuits to be introduced into a kiln or the like.

The system uses a special mechanism that enables printed circuits of any size which need to be subjected to a firing process to be picked up from a car, introduced onto a conveyor line situated inside a tunnel kiln, and finally picked up from the conveyor line and sent onto the next stage of processing.

BACKGROUND OF THE INVENTION

The manufacture of printed circuits uses photographic processes to make the tracks or pattern of the circuit on a base board, which consists of one or more layers of copper or other conductive materials.

For this purpose a layer of material sensitive to ultraviolet light, for example, is spread on the board; that layer is photographically exposed, and the board is then introduced into baths that dissolve the unexposed layer and the underlying layer made of conductive material to produce the circuit tracks.

These known procedures comprise various stages including the stage when the said sensitive layer is fired, during which the boards that constitute the circuit base are introduced into a kiln, usually the tunnel type, in which the coating layer is "fired".

At present, hooking devices are used for this purpose which allow the printed circuits to be picked up from feeder cars and introduced onto a conveyor line situated in the upper inner part of a tunnel kiln; finally the treated circuits are unloaded into a car situated at the tunnel outlet.

These known hooking devices comprise a pair of jaws, fitted to slide along lateral guides which allow synchronised movement in relation to the circuit feed area, so that by moving alternately back and forth they can grip the circuit at the sides and handle it for the purpose of the functions described above.

The main drawback of these known hooking devices is that the measurements of the circuit board need to be taken every time, and the jaw movements adapted to suit them.

In many known units the movement to be effected by the jaws is measured by optical sensors, which detect the width of the circuit and send the data detected to control devices which accordingly set the extent of the travel to be performed by the jaws so that they hook onto the two opposite sides of each printed circuit with precision.

All this obviously involves high costs for both the manufacture and the running of the plant, which have a considerable influence on the price of the finished product.

OBJECT OF THE INVENTION

The purpose of the present invention is to offer a new gripping system for handling flexible circuits, and in particular for their introduction onto the transport line present in kilns and pick-up at the end of the firing cycle; the said system requires the circuit boards to be gripped not at the sides but at their front edge, using a pair of actuators fitted at a distance from one another that does not exceed the minimum dimensions of the printed circuit to be introduced into the kiln.

The immediate advantage of the system proposed is that it totally eliminates the need to move the jaws laterally to adapt them to the width of the circuit, thus avoiding the use of expensive optical control and monitoring devices, and producing a drastic reduction in the cost of manufacturing and running the plant.

SUMMARY OF THE INVENTION

All these particular purposes and advantages are achieved, in accordance with the invention, by a handling system, designed in particular for hooking and picking up flexible circuits to be introduced into a kiln or the like, which basically comprises a gripping unit that slides along a pair of vertical supports fitted at either side of a feed line; sliders mounted on the said supports are equipped with horizontal shafts, the ends of which are fitted with gripping parts such as jaws or the like, normally facing downwards and activated in accordance with a rotary movement by a rotating pneumatic or similar type of piston.

The said jaws, which can grip the flexible circuit to be handled by hooking it at its front edge, are fitted at a certain distance apart which slightly exceeds the length of the gripping part supports fitted on the conveyor belt which is part of a tunnel kiln or the like, but does not exceed the minimum dimensions of the printed circuit that may be introduced into the kiln.

BRIEF DESCRIPTION OF THE DRAWINGS

Further characteristics and details of this invention will emerge more clearly from the following description of a preferable form of manufacture, illustrated by way of example but not of limitation in the annexed drawings in which.

DETAILED DESCRIPTION OF THE PREFERRED EMBODIMENT

With reference to the annexed figures, no. 1 indicates a conveyor belt designed to convey flexible circuits 2 into a kiln F, the said conveyor being fitted with drive parts 3 and a set of hooking supports 4, designed in such a way that the said circuits can be held back and made to advance inside the kiln while hanging, in order to be subjected to a firing process.

Figure 1:
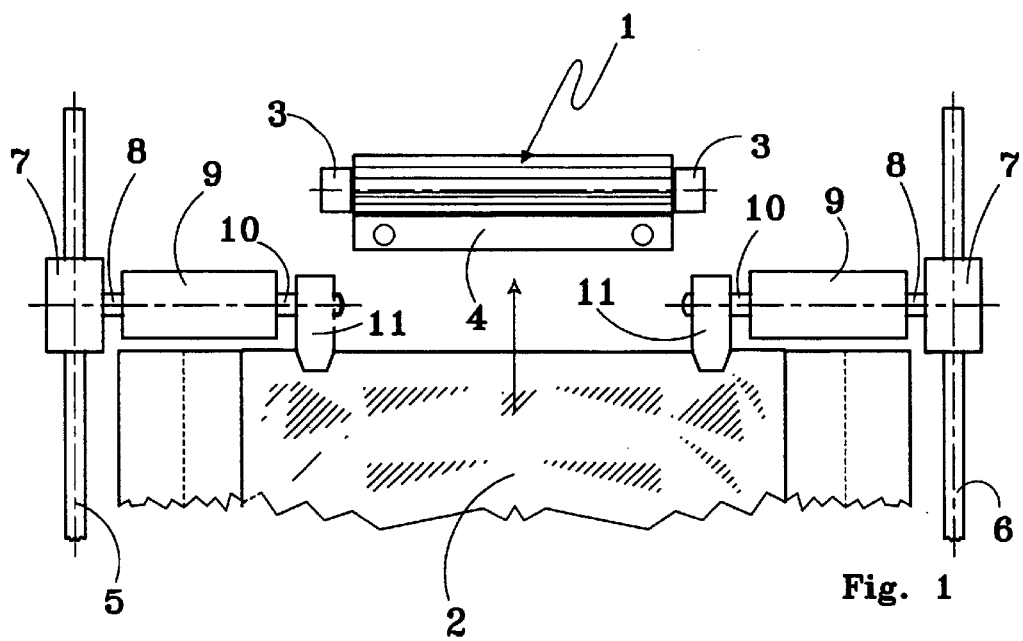
FIG. 1 shows the schematic front view of a gripper unit in accordance with the invention as a whole during lifting of a board
Figure 2:
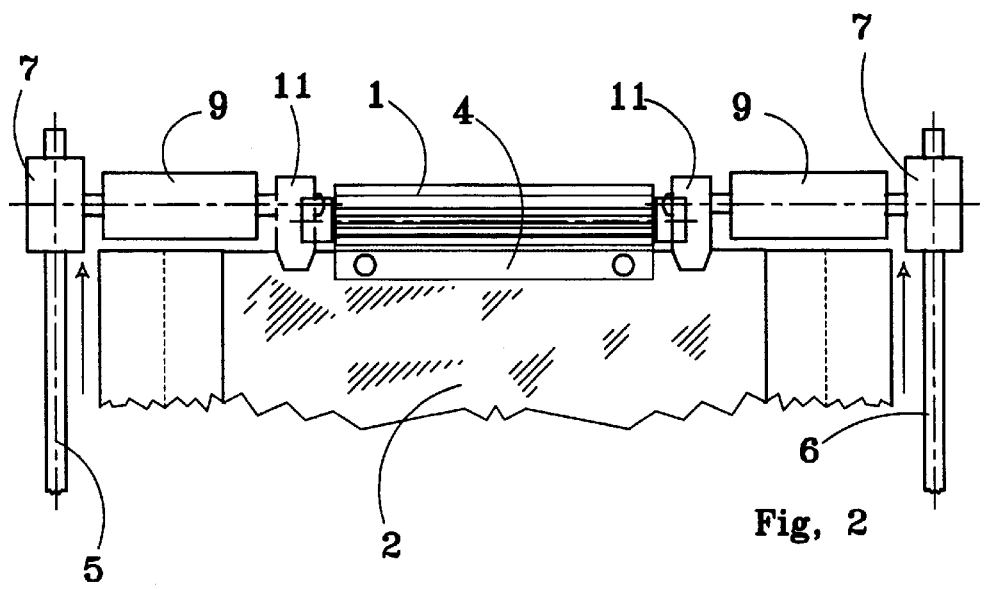
FIG. 2 shows a schematic view of the said unit in which the hooking of the printed circuit to the supports on the conveyor belt is illustrated

The device in accordance with the invention is used for loading and unloading printed circuits 2 onto supports 4 on the conveyor; as shown in FIGS. 1 and 2, the device basically consists of a pair of vertical uprights 5 and 6 to which sliders 7 are fitted.

Each of sliders 7, which can be moved in accordance with synchronised movements along its upright by drive parts such as pistons, recirculating-ball screws and the like, comprises a horizontal shaft 8 to which a rotating pneumatic piston 9 is fitted; the said piston supports a small shaft 10 coaxial with the previous shaft, allowing angular rotation, and the end of shaft 10 is fitted with a gripper part 11 represented by jaws or the like.

As shown in FIGS. 1 and 2, the jaws are situated side by side at a distance which slightly exceeds the width of supports 4, but does not exceed the minimum dimensions of printed circuit 2 which may be introduced into the kiln.

We will now briefly describe an example of the operation of the device in accordance with the invention.

Figure 3:
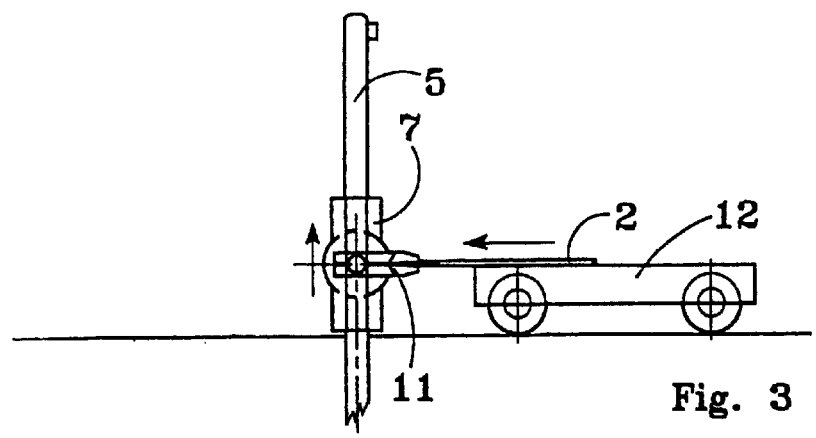
FIGS. 3 to 6 represent four schematic side views of the stages in which the circuit is picked up by the devices in question

A car 12 (FIG. 3) or other transport device conveys the printed circuits to the gripper device; at the start of the cycle, sliders 7 are completely lowered and jaws 11 are at the same level as the printed circuits and facing towards them.

Figure 4:
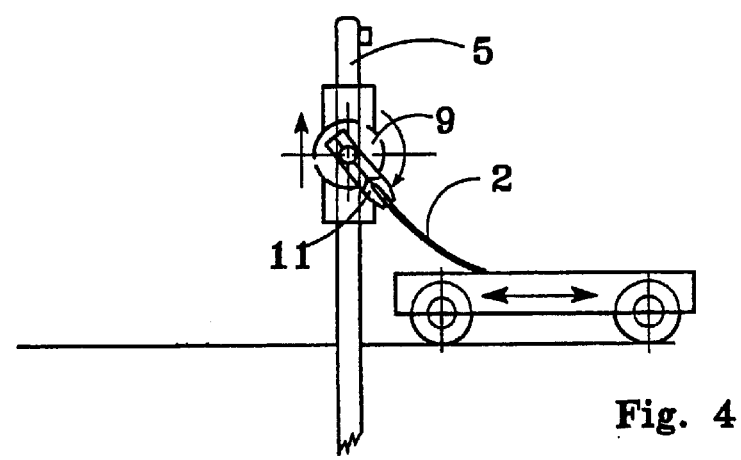
Figure 5:
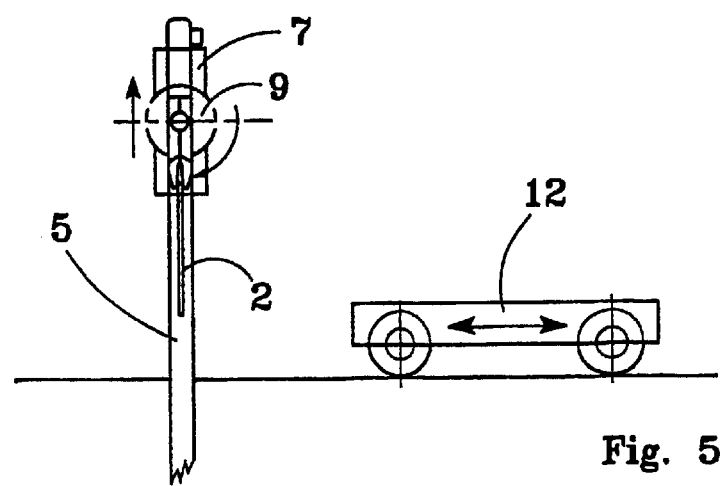

The circuit is inserted into jaws 11 which grip it, following which sliders 7 are raised in such a way that jaws 11, which can rotate idle in one direction while they are pushed in the opposite direction by the action of the piston, adopt a vertical position as a result of the weight of the circuit (FIGS. 4–5).

Figure 6:
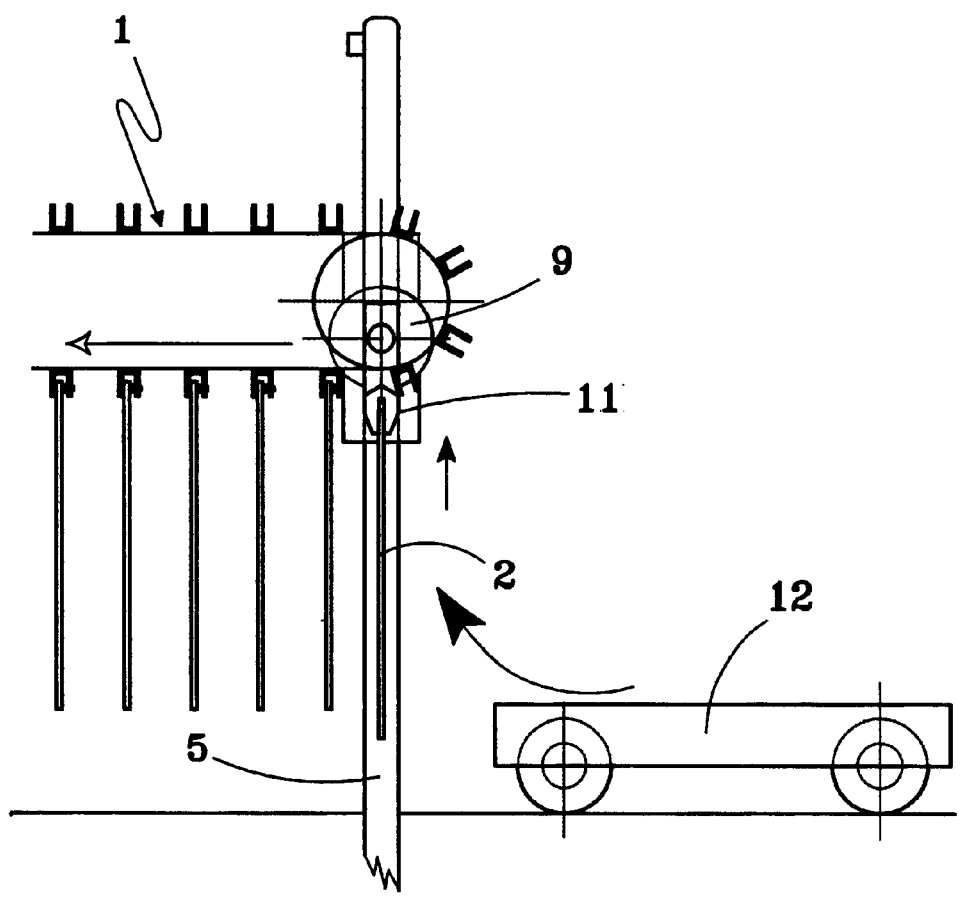

The raising of the two sliders 7 therefore involves upward movement of jaws 11 and of the corresponding circuit held by its front edge, so that when jaws 11 slide upwards as far as the sides of supports 4 on conveyor 1, which are designed to pick up circuit 2, the circuit is introduced into its support (FIG. 6).

At this point the jaws open, belt 1 advances by one step and brings the next support 4 into position, while jaws 11 are lowered to pick up the next circuit which has been loaded onto car 12 in the meantime.

As shown in FIG. 1, the distance between vertical uprights 5 and 6 is obviously calculated in such a way that it can laterally accept printed circuits 2 of any required dimensions, including those of larger width.

As will be seen, the system described makes it unnecessary to use expensive known optical control and monitoring devices, thus considerably reducing the manufacturing and running costs of the plant.

A preferred version of the system for handling printed circuits is described and illustrated, but a number of technically equivalent variations in the mechanical parts and components referred to are possible, and should be deemed to fall within the scope of this invention.

What is claimed is:

1. Apparatus for conveying circuit boards in a kiln, comprising in combination a conveyor, and a pair of vertical guides disposed on opposite sides of the conveyor, said conveyor having means to grip circuit boards by an edge of the circuit boards and to suspend and convey the circuit boards away from said vertical guides, gripping systems one on each of said vertical guides, means to move said gripping systems vertically along said guides, said gripping systems being rotatable about a common horizontal axis and being spaced apart a distance greater than a width of said conveyor and being adapted to receive and grip edges of said circuit boards in a lowered position of said gripping systems and, in a raised position said gripping systems being adapted to rotate about said horizontal axis to permit said circuit boards to swing downwardly for insertion of said edges of said circuit boards into said means to grip circuit boards on a conveyor.

2. Apparatus as claimed in claim 1, further comprising power means to rotate said gripping systems about said horizontal axis.

3. Apparatus as claimed in claim 2, said power means being rotating pneumatic pistons.

* * * * *